United States Patent
De Bock et al.

(10) Patent No.: US 11,574,832 B2
(45) Date of Patent: Feb. 7, 2023

(54) DIE ATTACH SYSTEMS INCLUDING A VERIFICATION SUBSTRATE

(71) Applicant: Assembléon B.V., Eindhoven (NL)

(72) Inventors: Alain De Bock, Neerpelt (BE); René Bouman, Vught (NL)

(73) Assignee: Assembléon B.V., Eindhoven (NL)

( * ) Notice: Subject to any disclaimer, the term of this patent is extended or adjusted under 35 U.S.C. 154(b) by 401 days.

(21) Appl. No.: 16/561,224

(22) Filed: Sep. 5, 2019

(65) Prior Publication Data

US 2020/0075381 A1 Mar. 5, 2020

Related U.S. Application Data

(60) Provisional application No. 62/727,447, filed on Sep. 5, 2018.

(51) Int. Cl.
| | |
|---|---|
| *H01L 21/68* | (2006.01) |
| *H01L 23/00* | (2006.01) |
| *H01L 23/544* | (2006.01) |
| *H01L 21/67* | (2006.01) |

(52) U.S. Cl.
CPC ...... *H01L 21/681* (2013.01); *H01L 21/67144* (2013.01); *H01L 23/544* (2013.01); *H01L 24/75* (2013.01); *H01L 24/83* (2013.01); *H01L 2224/75001* (2013.01); *H01L 2224/75702* (2013.01); *H01L 2224/75753* (2013.01); *H01L 2224/75755* (2013.01); *H01L 2224/8318* (2013.01); *H01L 2224/83132* (2013.01)

(58) Field of Classification Search
CPC ............... G08B 3/06; H01L 21/67132; H01L 21/67144; H01L 21/681; H01L 2224/75001; H01L 2224/75312; H01L 2224/75702; H01L 2224/75753; H01L 2224/75755; H01L 2224/759
See application file for complete search history.

(56) References Cited

U.S. PATENT DOCUMENTS

| | | | |
|---|---|---|---|
| 10,141,215 B2 * | 11/2018 | Wendt | H01L 24/83 |
| 2015/0380380 A1 | 12/2015 | Schmidt-Lange et al. | |
| 2019/0304852 A1 * | 10/2019 | Seyama | H01L 21/67144 |
| 2020/0075381 A1 * | 3/2020 | De Bock | H01L 21/681 |

FOREIGN PATENT DOCUMENTS

| | | |
|---|---|---|
| JP | 2016058543 | 4/2016 |
| TW | 201814819 | 4/2018 |
| WO | WO2004032207 | 4/2004 |

OTHER PUBLICATIONS

International Search Report completed Dec. 4, 2019 for PCT International Application No. PCT/EP2019/073766.

* cited by examiner

*Primary Examiner* — Minh N Trinh
(74) *Attorney, Agent, or Firm* — Christopher M. Spletzer, Sr.

(57) ABSTRACT

A die attach system is provided. The die attach system includes a verification substrate configured to receive a plurality of die, the verification substrate including a plurality of substrate reference markers. The die attach system also includes an imaging system for determining an alignment of the plurality of die with the verification substrate by imaging each of the plurality of die with respective ones of the plurality of substrate reference markers.

18 Claims, 10 Drawing Sheets

DIE ATTACH SYSTEMS INCLUDING A VERIFICATION SUBSTRATE

CROSS-REFERENCE TO RELATED APPLICATION

This application claims the benefit of U.S. Provisional Application No. 62/727,447, filed Sep. 5, 2018, the content of which is incorporated herein by reference.

FIELD

The invention relates to systems and methods for attaching a die to substrate, and more particularly, to improved systems and methods for accuracy verification and calibration for a die attach system.

BACKGROUND

In connection with the placement of a die on a substrate (e.g., the placement of a semiconductor die on a substrate), many conventional applications utilize a "pick and place" operation. In such operations, a die is "picked" from a semiconductor wafer or other die supply source, and then the die is moved to (and "placed" on) a target substrate. Such operations may also utilize one or more transfers between a "pick" tool and a "place" tool.

Certain die attach applications do not utilize a pick and place operation. For example, a die supply source (e.g., a wafer including a plurality of die) may be positioned between a bond tool and a substrate. Die included in the die supply source may be attached to a film or the like. After alignment between the bond tool, the die to be attached, and a placement location of the substrate—the bond tool presses the die against the placement location of the substrate.

Accuracy of a die attach operation tends to be performed after the operation is complete, using equipment separate from the die attach system. Such accuracy determinations tend to be time consuming and costly. Thus, it would be desirable to provide improved systems and methods for verifying the accuracy of die attach operations, and similar processes.

SUMMARY

According to an exemplary embodiment of the invention, a die attach system is provided. The die attach system includes a verification substrate configured to receive a plurality of die, the verification substrate including a plurality of substrate reference markers. The die attach system also includes an imaging system for determining an alignment of the plurality of die with the verification substrate by imaging each of the plurality of die with respective ones of the plurality of substrate reference markers.

According to another exemplary embodiment of the invention, a method of operating a die attach system is provided. The method includes the steps of: providing a verification substrate configured to receive a plurality of die, the verification substrate including a plurality of substrate reference markers; and imaging each of the plurality of die with respective ones of the plurality of substrate reference markers using an imaging system of the die attach system for determining an alignment of the plurality of die with the verification substrate.

According to yet another exemplary embodiment of the invention, another die attach system is provided. The die attach system includes: a die supply source holding a die supply form including a first plurality of reference markers; a first motion system for moving the die supply source; a bond head including a bond tool and an imaging system; a second motion system for moving the bond head; a substrate including a second plurality of reference markers; and wherein the imaging system is configured for imaging ones of the first plurality of reference markers and ones of the second plurality of reference markers in a single field of view.

According to yet another exemplary embodiment of the invention, a method of calibrating a die attach machine is provided. The method includes the steps of: providing a calibration die supply form including a calibration die supply, the calibration die supply including a first plurality of reference markers; providing a bond head including a bond tool and an imaging system; providing a substrate including a second plurality of reference markers; and imaging ones of the first plurality of reference markers and ones of the second plurality of reference markers in a single field of view with an imaging system of a die attach machine.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

DETAILED DESCRIPTION

As used herein, the term "die" is intended to refer to any structure including (or configured to include at a later step) a semiconductor chip or die. Exemplary "die" elements include a bare semiconductor die (such as a bare LED semiconductor die), a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, amongst others.

As provided above, certain die attach applications do not utilize a pick and place operation. For example, a die supply source (e.g., a wafer including a plurality of die, such as an LED wafer of other source of LED die) may be positioned between a bond tool and a substrate. The die supply source may include a plurality of die (e.g., an LED die) attached to a film or the like. Transfer of the die from the die supply source to the substrate may be accomplished using a number of processes. Two exemplary processes are described below.

According to a first exemplary process, after alignment of the bond tool, the die to be attached, and a placement location of the substrate—the bond tool presses the die against the placement location of the substrate. Adhesive on a lower surface of the die (and/or on the placement location of the substrate) is provided such that the die is now secured to the substrate. Such bond tools may include a needle, a plurality of pins (e.g., separably actuatable pins), etc. for contacting the die in connection with a transfer from the die supply source to the substrate.

According to a second exemplary process, after alignment of the bond tool, the die to be attached, and a placement location of the substrate—a laser or other light source (e.g., where the laser may be carried by the bond head) is used to transfer the die from the die supply source to the substrate. Adhesive on a lower surface of the die (and/or on the placement location of the substrate) is provided such that the die is now secured to the substrate.

While two exemplary processes are described above, it will be appreciated that other transfer processes are contemplated. Regardless of the transfer process, aspects of the invention may be utilized to improve the relevant die attach system and related processes.

According to certain exemplary embodiments of the present invention, accuracy verification may be integrated into a die attach system, for example, using a camera of the die attach system. Conventional substrates or dedicated substrates may be used for die attachment. Dedicated substrates have high relative accuracy of local references versus global substrate alignment references. Exemplary dedicated substrates include state-of-the-art glass substrates with lithographically applied reference markers, or metal substrates with laser engraved references. The camera (or other imaging system) of a die attach system may be used to register the x, y, and theta deviations of attached dies versus their respective substrate references. By imaging both the substrate reference and the die in the same camera image field-of-view, measurement errors are minimized and typically only depend on the quality of the camera and the relative accuracy of the substrate reference markers.

Thus, aspects of the invention may relate to obtaining x, y, and theta deviation data. Such deviation data may be used, for example: (i) to assemble an accuracy report on the die attach system; (ii) to determine systematic deviations and feed back into the system to improve the die attach accuracy; and (iii) to derive diagnostic information to invest root cause for accuracy related non-conformities.

This is different from conventional systems, for example, in that die attach accuracy related verification and calibration is integrated with the system that is used to attach the dies.

This is a significant improvement as compared to conventional systems and methods because, for example, additional measurement equipment (and related management) is not required to obtain the accuracy data. Shorter calibration/verification loops may be provided because of the integration with the die attach system itself.

Figure 1A:
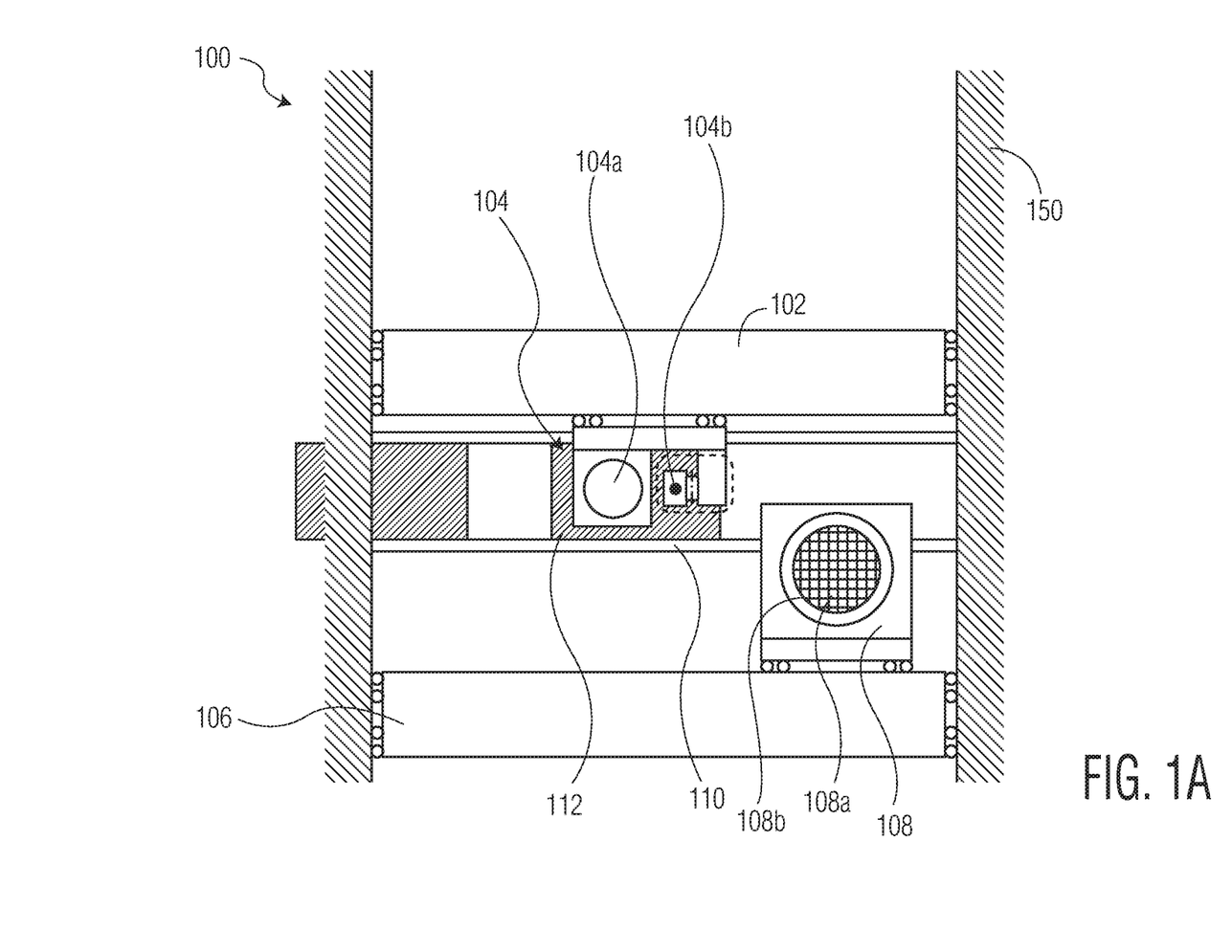
FIG. 1A is a block diagram top view of elements of a die attach system in accordance with an exemplary embodiment of the present invention.

Referring now to the drawings, FIG. 1A illustrates a die attach system 100. Die attach system 100 includes a support structure 110 for supporting a substrate 112, a die supply source 108 including a plurality of die 108a (where the plurality of die 108a are provided on a film/foil 108b included as part of die supply source 108) configured to be attached to substrate 112, and a bond head 104 including a bond tool 104b for contacting die 108a during a transfer of die 108a from die supply source 108 to substrate 112. Die attach system 100 also include a bond head support 102 and a supply support 106. Bond head support 102 and supply support 106 are each mounted on machine structure 150 such that bond head support 102 and supply support 106 are independently moveable relative to machine structure 150. Bond head support 102 supports moveable bond head 104. Bond head support 102 includes a motion system (e.g., a robot) for moving bond head 104 along the x, y directions. Bond head 104 includes a camera 104a (and other visions system components) for use in connection with alignment and/or inspection operations. Die supply source 108 is moveably mounted on supply support 106. Supply support 106 includes a motion system (e.g., a robot) for moving die supply source 108 along the x, y directions. In the exemplary embodiment of the invention shown in FIG. 1A (and in FIG. 1B), during a die attach operation, die supply source 108 is positioned between bond tool 104b and substrate 112 supported by support structure 110.

Figure 1B:
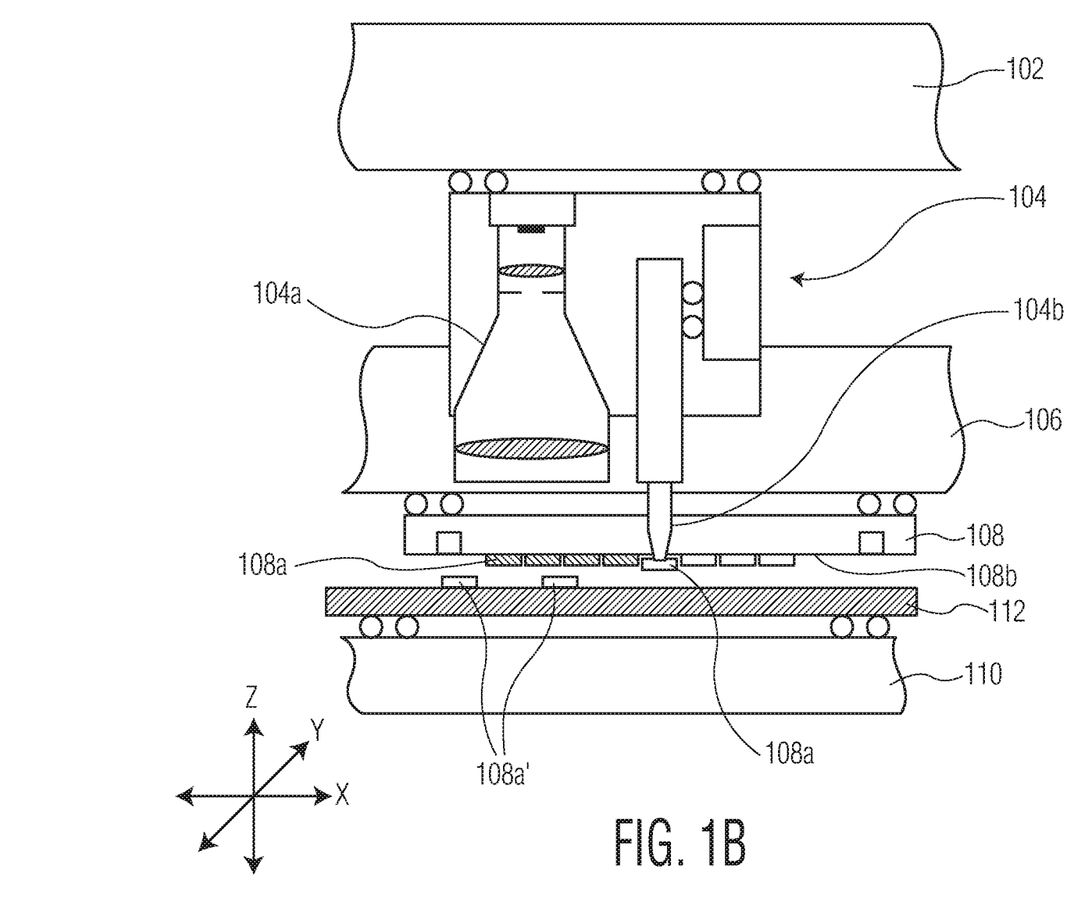
FIG. 1B is a side view of elements of the die attach system of FIG. 1A.

As compared to FIG. 1A, the side (partial cross sectional) view of FIG. 1B illustrates bond head 104 (including camera 104a and bond tool 104b) having been moved to a position over die 108a which, in turn, is positioned over substrate 112. Two "bonded" die 108a' have been attached to substrate 112 at respective bonding locations and bond tool 104b is shown engaging another die 108a above a third respective bonding location on substrate 112. Bond tool 104b (e.g., including a needle, a plurality of pins, etc.) presses die 108a against the third bonding location on substrate 112 to complete another transfer.

While FIGS. 1A-1B utilize a bond tool 104b for completing transfer of ones of a plurality of die 108a from a film 108b to substrate 112, other types of transfer are contemplated (e.g., the aforementioned laser transfer).

FIGS. 1A-1B illustrate substrate 112, which is a substrate for use in connection with typical die attach processes. Aspects of the invention utilize verification substrates useful in connection with operations such as (i) die attach accuracy verification, (ii) pre bond alignment, (iii) calibration operations, among others. Exemplary verification substrates are labelled herein with reference number "112a". In exemplary embodiments of the invention, verification substrate 112a is utilized in connection with a die attach machine (e.g., die attach machine 100 shown in FIGS. 1A-1B). In connection with certain exemplary methods described herein, verification substrate 112a will be located on support structure 110 of die attach system 100 (in place of substrate 112 from FIGS. 1A-1B).

Figure 2:
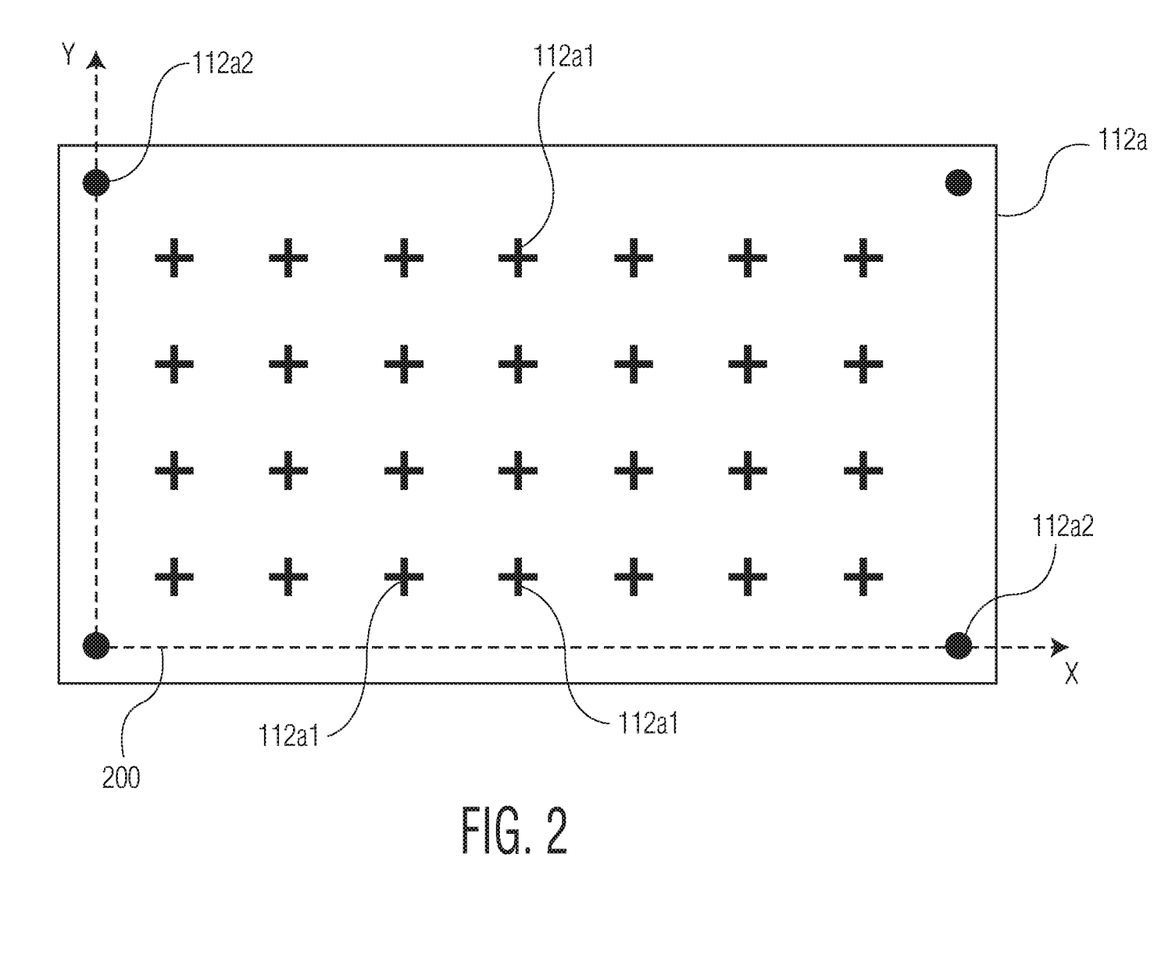
FIG. 2 is a top view of a verification substrate in accordance with an exemplary embodiment of the present invention.

FIG. 2 illustrates verification substrate 112a. Verification substrate 112a includes a plurality of local substrate reference markers 112a1, and a plurality of global alignment reference markers 112a2. Verification substrate 112a may be a glass substrate, a metal substrate, etc. Reference markers 112a1, 112a2 may be lithographically applied reference markers, laser engraved reference markers, among other types of reference markers. Accuracy performance (e.g., in the x, y, and theta dimensions) of a die attach system (such as die attach system 100) may be provided relative to verification substrate 112a. Relative measurements taken by a camera of a die attach system (e.g., camera 104a of die attach system 100) may be converted using verification substrate 112a. Such measurements may also involve reference coordinate system 200 also shown in FIG. 2, where reference coordinate system 200 is an xy coordinate system of a die attach system (e.g., die attach system 100).

Figure 3:
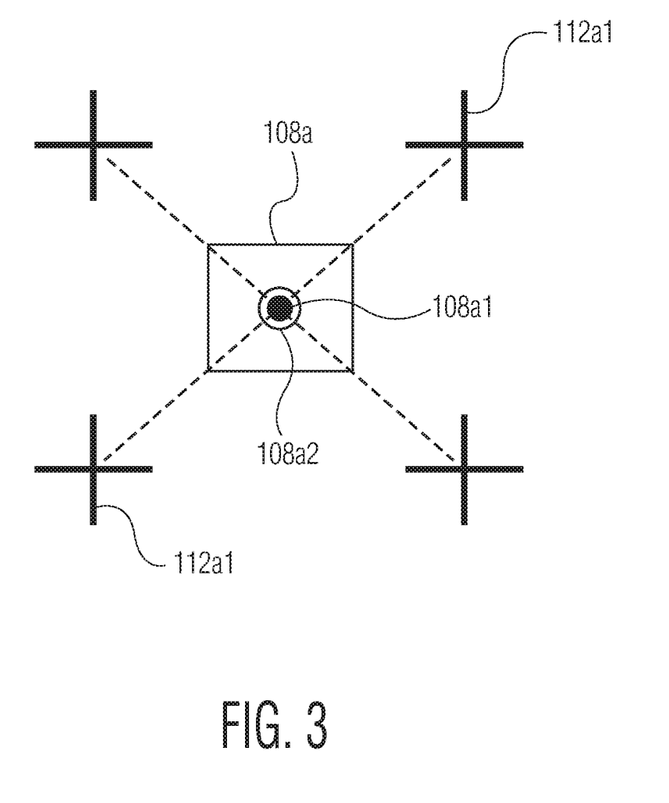
FIG. 3 is a top view of a portion of the substrate of FIG. 2, indicating an ideal die attach location, in accordance with an exemplary embodiment of the present invention.

FIG. 3 illustrates an exemplary die 108a attached to a die attach location on verification substrate 112a. More specifically, die 108a is attached between four (4) local substrate reference markers 112a1 on verification substrate 112a. In FIG. 3, die 108a is shown at an ideal location. FIG. 3 shows a die center 108a1 centered within a theoretical ideal location 108a2 for die center 108a1 (where ideal location 108a2 is, in the example shown in FIG. 3, at a center of substrate reference markers 112a1).

Figure 4:
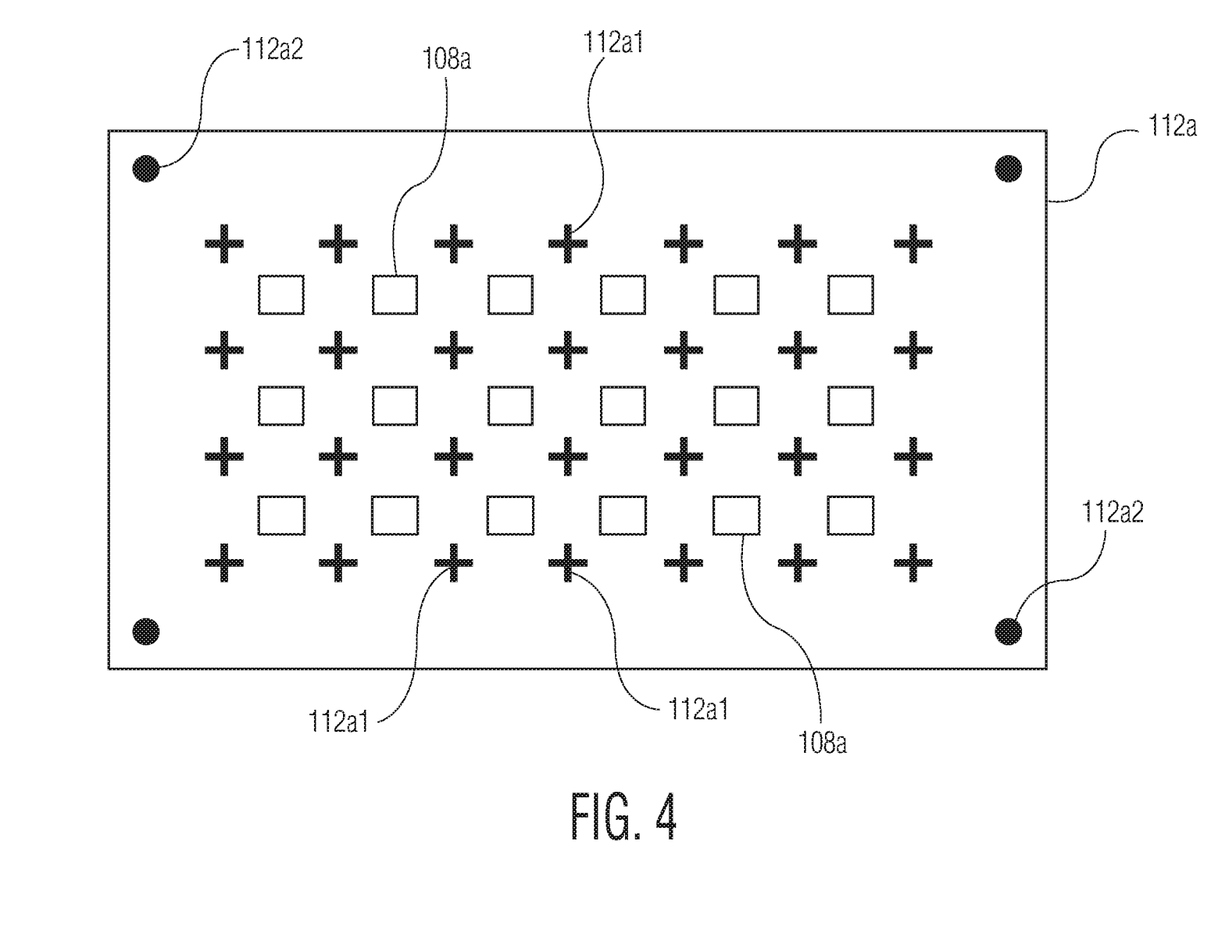
FIGS. 4-6 are top view illustrations of a verification substrate used in connection with a die placement accuracy process in accordance with an exemplary embodiment of the present invention.
Figure 5:
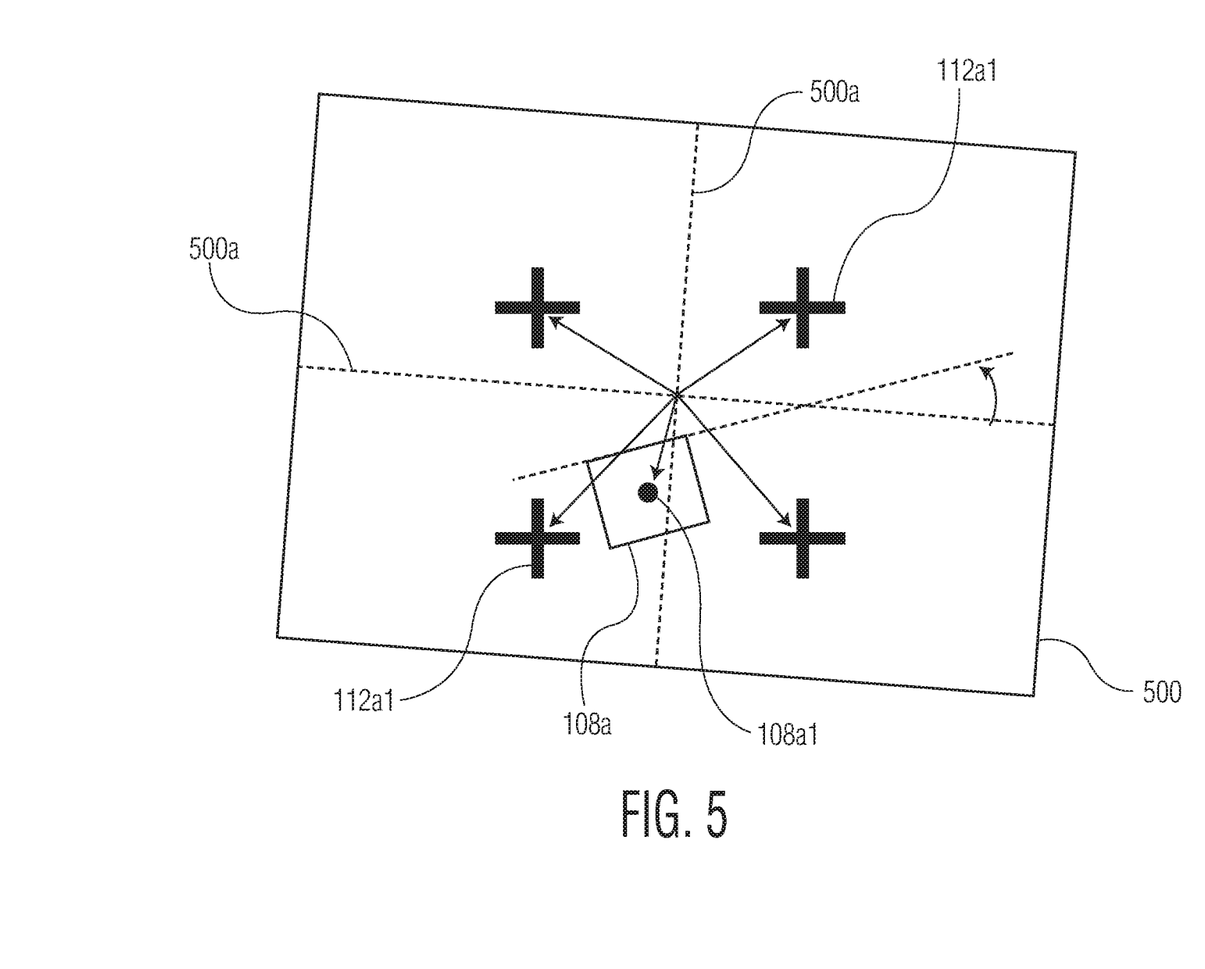
Figure 6:
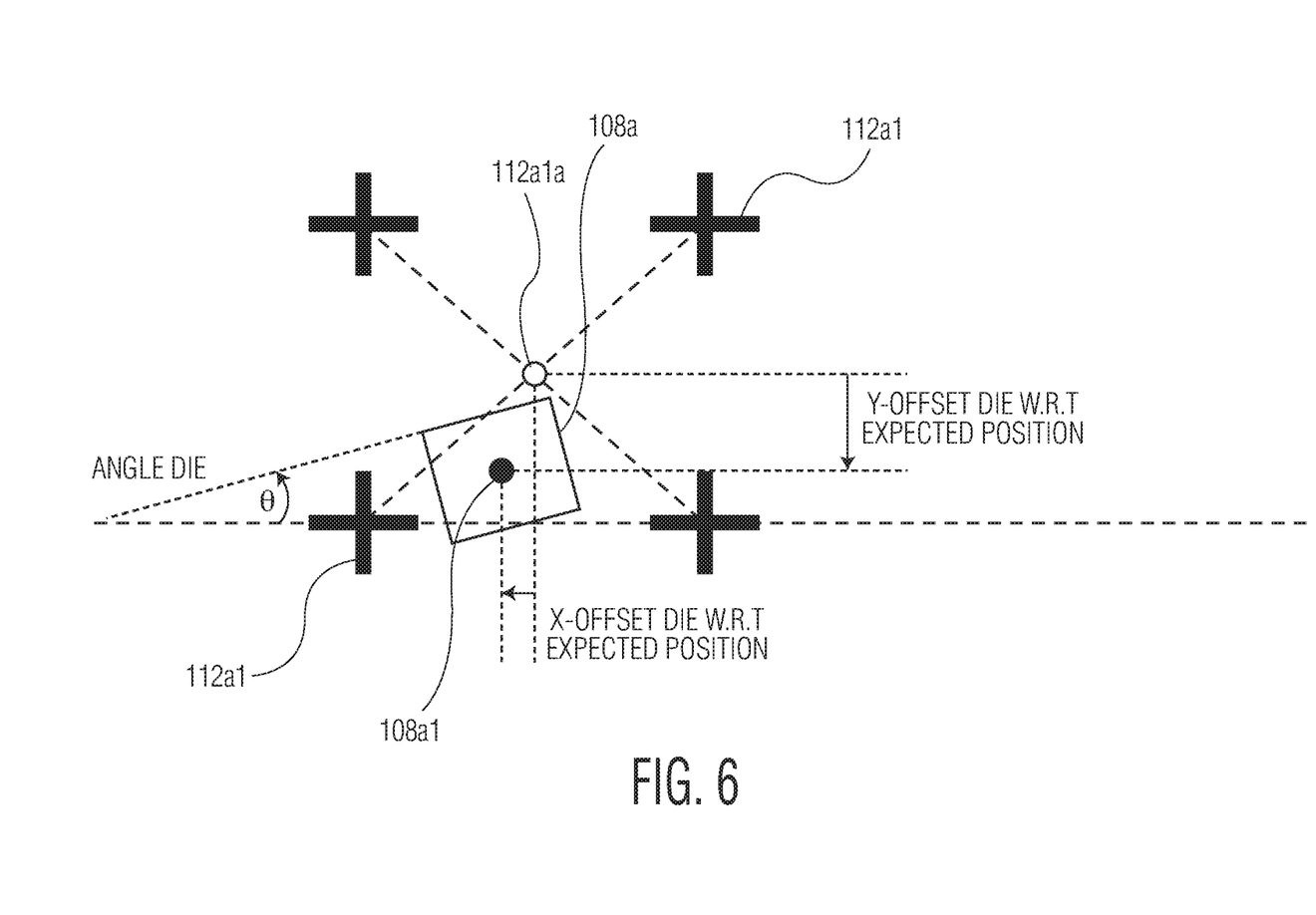

FIGS. 4-6 illustrate steps of a method of determining (and/or verifying) the accuracy of a die attach operation. FIG. 4 illustrates a plurality of die 108a attached to bonding locations (target locations) of verification substrate 112a. For example, the plurality of die 108a may be attached to verification substrate 112a using die attach machine 100 shown in FIGS. 1A-1B (e.g., using bond tool 104b). The die attach process may be accomplished by imaging one or more plurality of global alignment reference markers 112a2 before bonding. The relative location of the local substrate reference markers 112a1 to the global alignment reference markers 112a2 is accurately known (e.g., either by prior measurement or precise manufacturing).

FIG. 5 illustrates a field of view 500 (e.g., taken with a camera of a die attach system, such as die attach system 100), including measurement axes 500a. After the plurality of die 108a are attached to verification substrate 112a (as in FIG. 4), images are taken of each bonded die 108a and its corresponding local substrate reference markers 112a1 in a single field of view, as shown in FIG. 5. This imaging (using field of view 500) results in initial measurement results obtained in the camera measurement coordinate system. While FIG. 5 shows a single field of view measurement of a single die 108a bonded to a portion of verification substrate 112a, it is understood that multiple images may be taken of multiple bonded die 108a.

After the imaging of FIG. 5, the location of die 108a relative to the local substrate reference system (including local substrate reference markers 112a1, center point 112a1a) is determined, as shown in FIG. 6. As shown in FIG. 6, the measurement results are illustrated after conversion to the substrate reference system, which typically involves de-rotation of the camera angle relative to the substrate. This makes measurement results invariant to incidental camera orientation and position. As shown in FIG. 6, in addition to an angular theta deviation (about the theta axis shown in FIG. 6), an x-offset and a y-offset are determined.

Figure 7A:
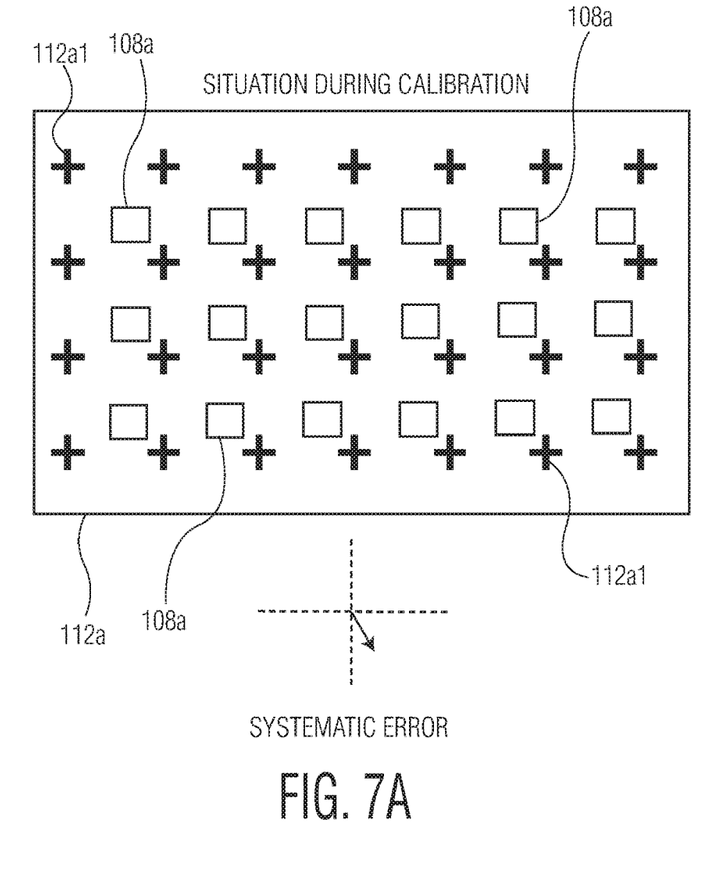
FIGS. 7A-7B are top view illustrations of a calibration operation in accordance with an exemplary embodiment of the present invention.
Figure 7B:
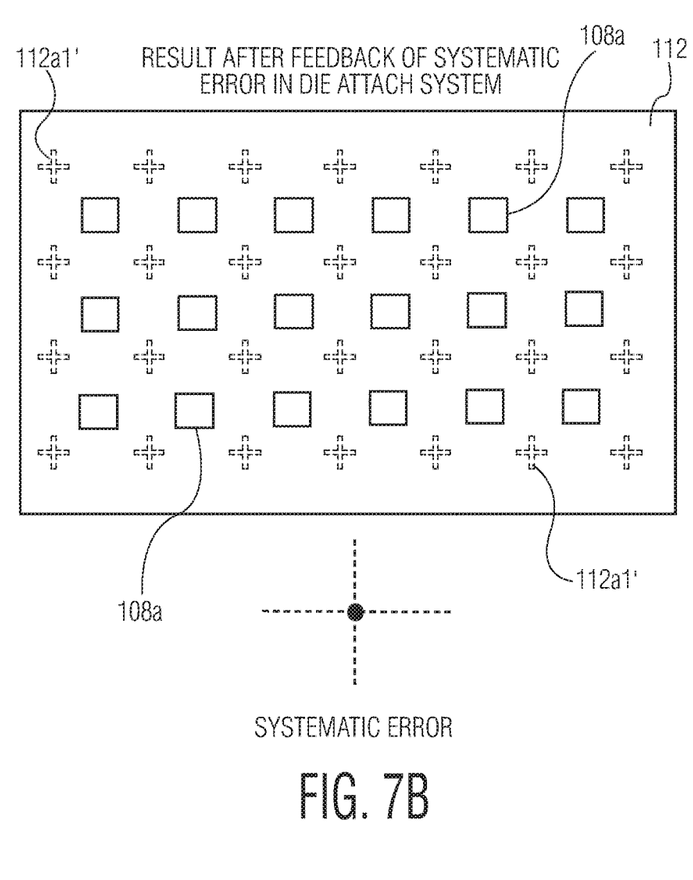

While FIGS. 4-6 illustrate a method of determining the accuracy of die placement on a substrate (which may be used as feedback for corrections in future die placement operations), other improvements may be provided in accordance with the inventive systems and methods described herein. FIGS. 7A-7B illustrate a method of determining (and correcting) systematic deviations in a die attach operation. Such a systematic error is typically obtained as the mean or median value of the measured die-offsets. FIG. 7A illustrates a plurality of die 108a bonded to verification substrate 112a (where the die are bonded on a die attach machine, such as die attach machine 100 including bond tool 104b). As can be seen in FIG. 7A, each of the plurality of die 108a are offset from desired bonding location between adjacent local substrate reference markers 112a1 (the systematic error is illustrated in FIG. 7A as an offset that is off center from the cross at the bottom of FIG. 7A).

After determining (and/or applying) the systematic error (for example, by correcting for a mean or median die offset), another bonding operation may be completed. FIG. 7B illustrates the plurality of die 108a bonded to a substrate 112 (e.g., see substrate 112 shown in FIG. 1A) after feedback from the systematic error determination. In FIG. 7B, the local substrate reference markers 112a1' are shown in "phantom" format because they are likely not on substrate 112 (as they would be on verification substrate 112a). Nonetheless, the feedback results in improved bonding as shown in FIG. 7B, with the bonded die 108a more accurately placed between adjacent local substrate reference markers 112a1' (the systematic error is illustrated in FIG. 7B as being corrected, with a "dot" centered on the cross at the bottom of FIG. 7B). Of course, it is understood that the feedback may be accomplished by bonding the die 108a to another verification substrate 112a to confirm the improved accuracy (as opposed to the substrate 112 shown in FIG. 7B).

Figure 8A:
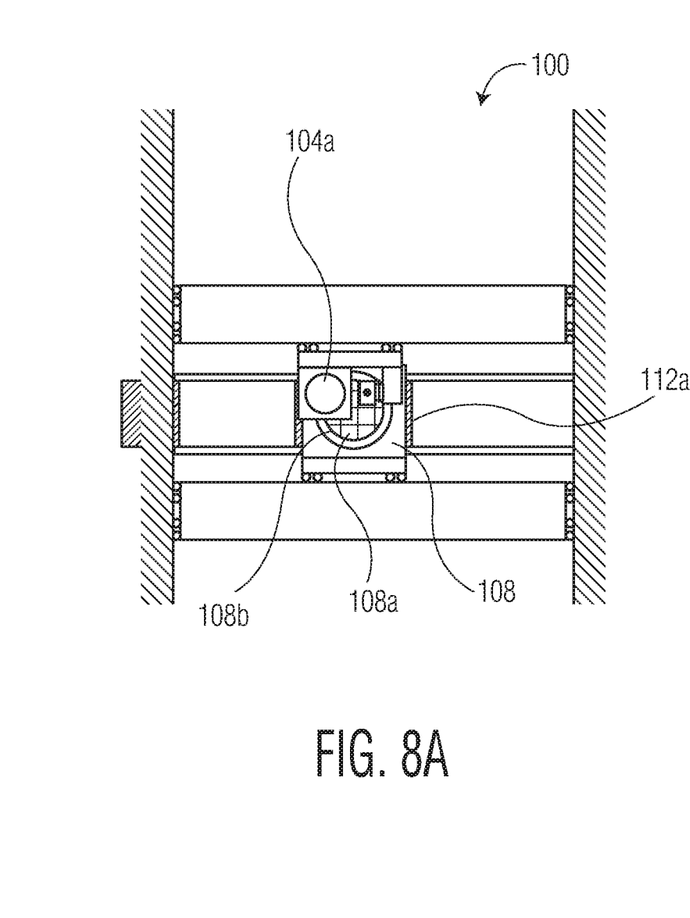
FIGS. 8A-8B are top view diagrams illustrating a pre-bond inspection operation in accordance with an exemplary embodiment of the present invention.
Figure 8B:
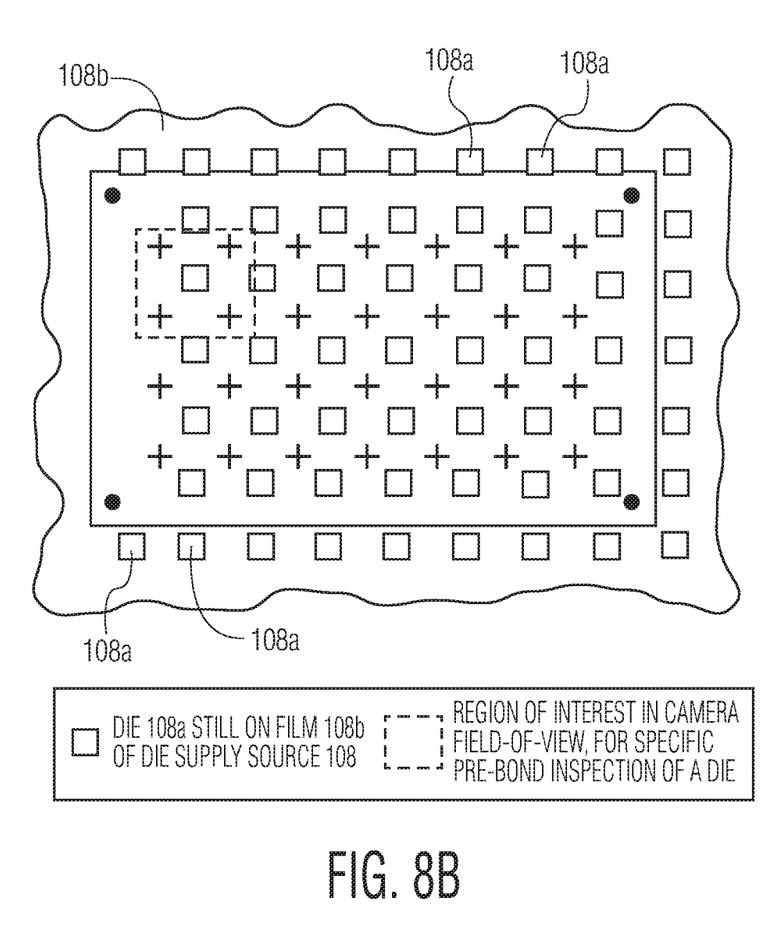

In addition to the die attach accuracy verification of FIGS. 4-6, and the systematic error determination and correction shown in FIGS. 7A-7B, additional embodiments of the invention are contemplated. For example, certain accuracy related diagnostics may be performed within the scope of the invention. FIGS. 8A-8B illustrate an example of such a diagnostic technique in connection with a pre-bond accuracy inspection. FIG. 8A is a block diagram view of die attach system 100 where camera 104a is imaging a die 108a while still attached to film 108b. That is, the imaging is performed before a die attach operation is completed. The plurality of die 108a are still on the film 108b of die supply source 108. The film is typically transparent (or semi transparent, or translucent), such that the markers of a substrate below the film are well visible and can be measured accurately. In FIGS. 8A-8B, verification substrate 112a is positioned below die supply source 108 (where the plurality of die 108a are still on film 108b). More specifically, die supply source 108 (and/or verification substrate 112a) is moved such that at least one of the plurality of die is positioned above a corresponding bonding location of verification substrate 112a (i.e., between respective local substrate reference markers 112a1). In this orientation, a field of view of the camera is imaged to show the relative position of the die 108a to the respective local substrate reference markers 112a1. FIG. 8B illustrates a single die 108a in such a field of view. Using the image taken from this field of view, accuracy data may be obtained before the die attach process occurs. This image data may be used as feedback to correct for any accuracy issue.

Figure 9A:
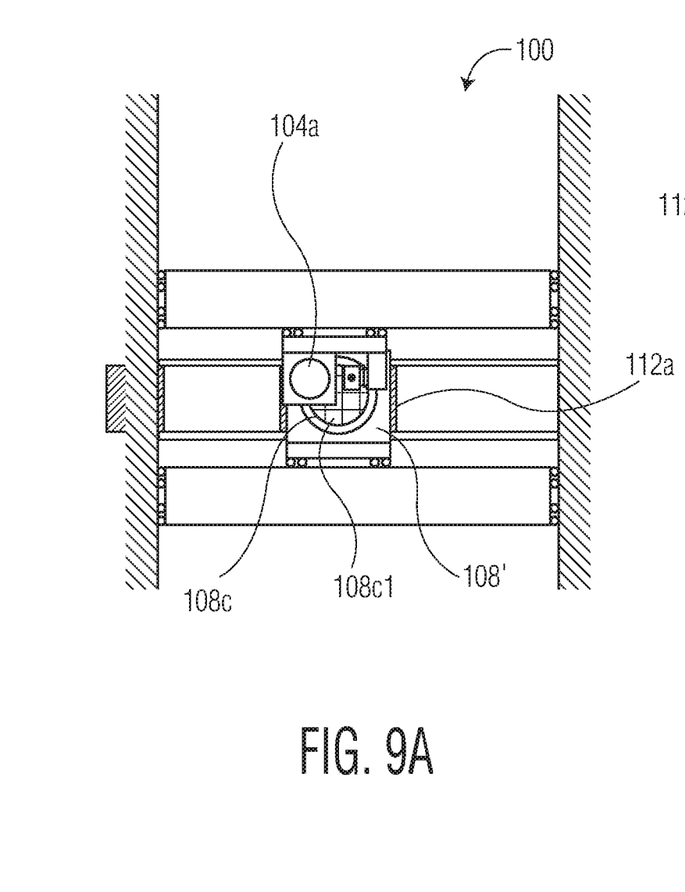
FIGS. 9A-9B are top view diagrams illustrating a calibration operation in accordance with an exemplary embodiment of the present invention.
Figure 9B:
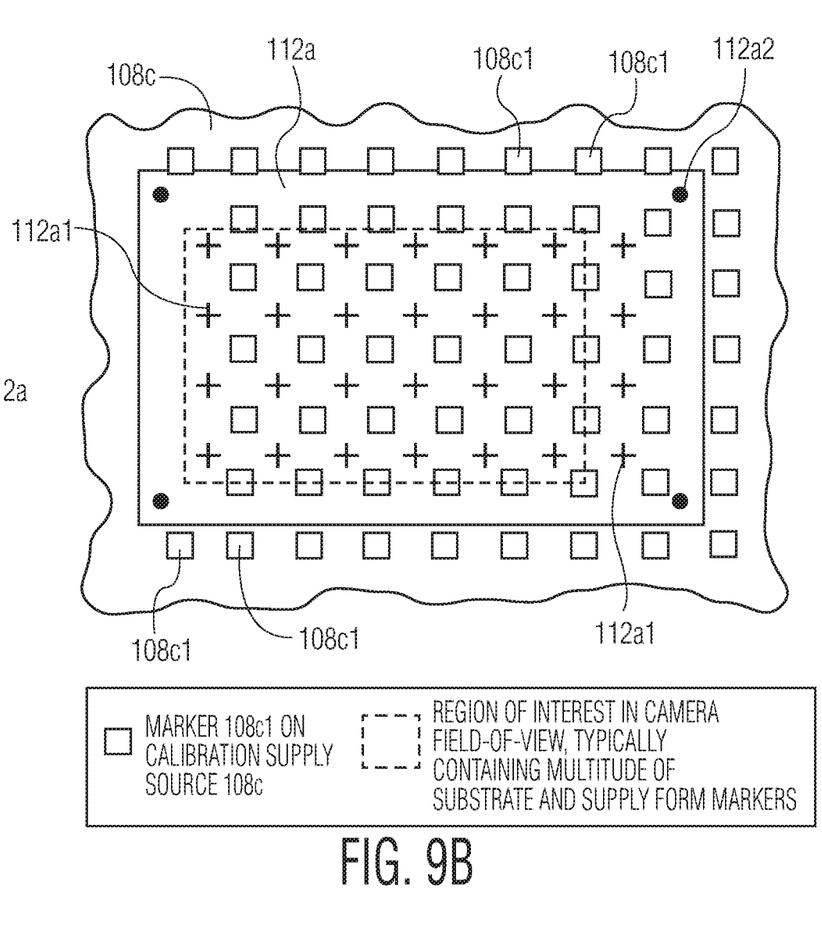

In another exemplary method of the invention, FIGS. 9A-9B illustrates a calibration operation (e.g., a robot stage calibration). The principle of relative marker offset measurement can be applied to robot stage calibration (where a robot stage is a portion of the die attach machine being moved by a motion system such as bond head 104 being moved by a motion system, or die supply source 108 being moved by another motion system). In connection such a robot stage calibration, typical non-linear deviations of robot axes are measured as function of the x,y location in the work-area of the robot stage. For the robot stage having a downwards looking camera (e.g., bond head 104 being moved by a motion system of bond head support 102), the substrate marker measurements can be used directly to create a so called error map of the robot stage. For the robot stage without the downwards looking camera (e.g., die supply source 108 being moved by a motion system of supply support 106), a similar error map can be obtained using the camera of the other stage (e.g., camera 104*a*) as a measurement device. For this purpose, a calibration die supply form is inserted in place of an actual die supply source, where an exemplary calibration die supply form includes a lithographically manufactured glass plate with markers (a so called "calibration wafer"). The deviations of the calibration die supply form are obtained by measuring the relative offsets of the supply form markers with respect to the substrate reference markers. This may done on various locations covering the work area of the robot stage. Both robot stages can thus be calibrated to the same calibration reference, at the same time. Typically, multiple markers in one field-of-view are used for this purpose (both on substrate and supply form), creating a more accurate and robust measurement capability of positional and angular offsets.

Referring to the specific example shown in FIGS. 9A-9B, a calibration die supply form 108' is provided in place of the die supply source 108 in other drawings provided herein. Calibration die supply form 108' holds calibration die supply 108*c* including supply form markers 108*c*1. While these supply form markings are square (similar to the shape of die 108*a* from previous drawings), any type of supply form marker shape is contemplated. Substrate 112*a* (including substrate reference markers 112*a*1, 112*a*2) is positioned below calibration die supply form 108'. In this configuration, camera 104*a* may be used to measure the relative offsets of the supply form markers 108*c*1 with respect to the substrate reference markers 112*a*1 and/or 112*a*2. The relative offsets may be used in connection with the robot stage calibration of each of the robot stages (e.g., bond head 104 being moved by a motion system of bond head support 102, and die supply source 108 being moved by a motion system of supply support 106) as described above.

While the invention has been described and illustrated primarily with respect to die attach operations where there is no "pick" operation, it is not limited thereto. The invention has broad applicability in the semiconductor bonding industry including die attach machines (sometimes referred to as die bonders) or other packaging machines (e.g., flip chip machines/operations, advanced packaging operations, etc.).

While exemplary embodiments of the invention are illustrated and described with respect to markers having certain shapes (e.g., cross shaped markers, round markers, rectangular markers, etc.), and certain numbers of markers with respect to a single die (e.g., four substrate reference markers 112*a*1 surrounding each die), etc.—these types of details are exemplary in nature, and non-limiting with respect to the scope of the invention.

Although the invention has been described and illustrated with respect to the exemplary embodiments thereof, it should be understood by those skilled in the art that the foregoing and various other changes, omissions and additions may be made therein and thereto, without parting from the spirit and scope of the present invention. Rather, various modifications may be made in the details within the scope and range of equivalents of the invention and without departing from the invention.

What is claimed:

1. A die attach system comprising:
    a verification substrate configured to receive a plurality of die, the verification substrate including a plurality of substrate reference markers;
    an imaging system for determining an alignment of the plurality of die with the verification substrate by imaging each of the plurality of die with respective ones of the plurality of substrate reference markers in a single field-of-view;
    a bond tool for contacting each of the plurality of die during a transfer from a die supply source to the verification substrate; and
    a supply support for supporting the die supply source, the die supply source being positioned between the bond tool and the verification substrate.

2. The die attach system of claim 1 wherein the imaging system includes a camera.

3. The die attach system of claim 1 wherein the imaging system is configured to obtain image data, the image data being used determine a positional deviation between each of the plurality of die with the respective ones of the plurality of substrate reference markers using image data from the imaging system.

4. The die attach system of claim 3 wherein the positional deviation includes deviation components along the x-axis, along the y-axis, and about a theta axis.

5. The die attach system of claim 1 wherein each of the plurality of die along with respective ones of the plurality of substrate reference markers are imaged in a single field-of-view of a camera of the imaging system.

6. The die attach system of claim 1 wherein the verification substrate is an accuracy verification substrate, and the alignment determined using the imaging system is a placement accuracy of each of the plurality of die after placement on the verification substrate.

7. The die attach system of claim 1 wherein the verification substrate is a glass substrate.

8. The die attach system of claim 1 wherein the verification substrate is an accuracy verification substrate, and the alignment determined using the imaging system is a pre bond alignment determined prior to bonding of each of the plurality of die to a substrate, where each of the plurality of die is positioned above the verification substrate during the pre bond alignment determination.

9. The die attach system of claim 8 wherein each of the plurality of die is adhered to a film of a die supply source during the pre bond alignment determination.

10. The die attach system of claim 1 wherein the supply support is independently moveable relative to a machine structure.

11. The die attach system of claim 1 wherein the die supply source is moveably mounted on the supply support.

12. The die attach system of claim 1 further comprising a support structure for supporting the verification substrate.

13. The die attach system of claim 1 wherein the plurality of substrate reference markers includes (i) a global alignment reference marker and (ii) a local substrate reference marker.

14. The die attach system of claim 1 wherein the plurality of substrate reference markers includes (i) a plurality of global alignment reference markers and (ii) a plurality of local substrate reference markers.

15. The die attach system of claim 1 wherein the plurality of substrate reference markers includes (i) a global alignment reference marker and (ii) a plurality of local substrate reference markers, the plurality of local substrate reference markers including at least four local substrate reference markers, wherein the at least four local substrate reference markers are configured such that a single die can be placed between the at least four local substrate reference markers.

16. The die attach system of claim 1 wherein the single field of view includes a measurement axis.

17. The die attach system of claim 1 wherein the single field of view includes a plurality of measurement axes.

18. The die attach system of claim 1 wherein the die attach system is configured to determine a systematic error from an offset of a plurality of die bonded to the verification substrate.

* * * * *